US006605845B1

(12) United States Patent
Liang

(10) Patent No.: US 6,605,845 B1
(45) Date of Patent: *Aug. 12, 2003

(54) ASYMMETRIC MOSFET USING SPACER GATE TECHNIQUE

(75) Inventor: Chunlin Liang, San Jose, CA (US)

(73) Assignee: Intel Corporation, Santa Clara, CA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/940,874

(22) Filed: Sep. 30, 1997

(51) Int. Cl.[7] .................... H01L 29/76; H01L 29/94; H01L 31/062; H01L 31/113; H01L 31/119
(52) U.S. Cl. ........................ 257/368; 257/408
(58) Field of Search ................. 257/368–369, 257/408–414, 344, 382–384, 900; 438/286, 302–305

(56) References Cited

U.S. PATENT DOCUMENTS

| | | | | |
|---|---|---|---|---|
| 5,216,272 A | * | 6/1993 | Kubokoya et al. | 257/369 |
| 5,384,479 A | * | 1/1995 | Taniguchi | 257/408 |
| 5,547,900 A | * | 8/1996 | Lin | 438/586 |
| 5,648,286 A | * | 7/1997 | Gardner et al. | 438/286 |
| 5,677,224 A | * | 10/1997 | Kadosh et al. | 257/369 |
| 5,780,902 A | * | 7/1998 | Komuro | 257/408 |
| 5,801,088 A | | 9/1998 | Gardner et al. | |
| 5,825,062 A | * | 10/1998 | Muramoto | 257/315 |
| 5,891,782 A | * | 4/1999 | Hsu et al. | 438/305 |
| 5,918,132 A | | 6/1999 | Qian et al. | |
| 5,923,981 A | | 7/1999 | Qian | |
| 5,935,867 A | * | 8/1999 | Alvis et al. | 438/302 |
| 5,940,708 A | * | 8/1999 | Aoyama et al. | 438/305 |
| 6,022,815 A | | 2/2000 | Doyle et al. | |

OTHER PUBLICATIONS 1.5 nm Direct–Tunneling Gate Oxide Si MOSFET's Momose et al. IEEE Transactions on Electron Devices, vol. 43, No. 8, Aug. 1996.*

* cited by examiner

Primary Examiner—Steven Loke
Assistant Examiner—Cuong Quang Nguyen
(74) Attorney, Agent, or Firm—Blakely, Sokoloff, Taylor & Zafman LLP

(57) ABSTRACT

A field effect transistor including a semiconductor substrate having a first doped region and a second doped region wherein the first doped region and the second doped region are defined by an implantation property. The implantation property of the first doped region has a first implantation characteristic and the implantation property of the second doped region has a second implantation characteristic, and the first implantation characteristic are different from the second implantation characteristic.

11 Claims, 8 Drawing Sheets

ASYMMETRIC MOSFET USING SPACER GATE TECHNIQUE

BACKGROUND OF THE INVENTION

1. Field of the Invention

The invention relates generally to the field of semiconductor devices and, more particularly, to the structure and fabrication of such devices.

2. Description of Related Art

A goal of integrated circuit design is improving device driving capability and device reliability. This goal becomes significantly more complex as device dimensions are reduced, such as for example below channel lengths of 0.5 $\mu$m. Further, increased driving capability or device speed and device reliability are sometimes contradictory goals for traditional metal oxide semiconductor field effect transistor ("MOSFET") doped region or source/drain architecture, particularly in short channel devices. Conventionally, to improve device performance, the source/drain parasitic resistance of a MOSFET must be minimized. On the other hand, hot electron immunity and better short channel characteristics (e.g., punch-through, drain induced barrier lowering ("DIBL"), threshold voltage roll-off, off-state leakage, etc.) can be significantly improved by adopting source/drain structures that tend to be more resistive. Examples of such structures include structures with implantation characteristics of lightly doped drain ("LDD"), extremely shallow junctions, and wide spacers. Such structures tend to degrade device performance.

As device dimensions are reduced, the lateral electric field generated in MOS devices increases. A strong enough electric field gives rise to so-called "hot-carrier" effects in MOS devices. Hot-carrier effects cause unacceptable performance degradation particularly in MOS devices with short channel lengths, e.g., less than 0.5 microns ($\mu$m). To overcome this problem, lightly doped drains (LDDs) are used to absorb some of the potential into the drain and thus reduce the electric field. The field is reduced by the LDD structure because the voltage drop is shared by the drain and the channel, in contrast to a conventional drain structure, in which almost the entire voltage drop occurs across the channel region. The reduction of the electric field causes a reduction in hot carriers injected into gate oxide which greatly increases the stability of the device.

A LDD structure is typically formed by two implants. The first implant is a lightly doped section self-aligned to the gate electrode. The second implant is self-aligned to sidewall spacers placed adjacent to the gate. The second implant is a heavier dose that forms a low resistivity region of the source and drain region. The second implant is to increase junction depth which lowers both the sheet resistance and the contact resistance of the source and drain and provides better protection against junction spiking.

A major disadvantage of LDD structures is their increased parasitic resistance of the source and drain regions caused by the lightly doped regions of the source/drain. This increase in parasitic channel resistance results in devices that have lower driving current and slower performance.

Examples of short channel effects on device performance are punch-through and DIBL. Punch-through is observed when the electric field in the drain induces a local valley in the energy barrier between source and drain. Such energy forms approximately when the width of the depletion regions around the source and drain meet as a result of the widening of the drain depletion region by a reverse-bias voltage on the drain. This results in an increased current flow from source to drain through the substrate body. DIBL occurs when the application of a drain voltage reduces the barrier height between source and drain at the channel. As a result, the drain voltage creates an increased subthreshold current (i.e., subthreshold current is the current that flows between the drain and source before the magnitude of the gate voltage exceeds the threshold voltage of the device) in the channel region at the silicon-gate oxide interface.

Punch-through and DIBL can be suppressed by keeping the total width of the two depletion regions smaller than the channel length. This is generally accomplished by using shallow junctions and pocket implants, in which an additional implant, such as for example a boron implant, is applied that decreases the lateral widening of the drain-depletion region below the surface without increasing the doping under the junction regions. However, shallow junctions and pocket implants tend to increase parasitic source and drain resistance.

In the conventional fabrication of semiconductor devices, the source and drain regions of a device are fabricated at the same time with the same implantation characteristics (e.g., LDD, shallow junction, pocket implant, etc.). Such fabrication techniques facilitate the processing steps required to make a device, but do not account for the individual performance effects attributable to each of the source region and the drain region individually.

SUMMARY OF THE INVENTION

A field effect transistor and a method for forming a field effect transistor are disclosed. In one embodiment, the field effect transistor includes a semiconductor substrate having a first doped region and a second doped region wherein the first doped region and the second doped region are defined by an implantation property. The implantation property of the first doped region has a first implantation characteristic and the implantation property of the second doped region has a second implantation characteristic, and the first implantation characteristic is different from the second implantation characteristic.

Additional features and benefits of the invention will become apparent from the detailed description, figures, and claims set forth below.

DETAILED DESCRIPTION OF THE INVENTION

Embodiments in accordance with the invention include a field effect transistor and a method of forming a field effect transistor.

In the following description, numerous specific details are set forth such as specific materials, thicknesses, processing steps, process parameters, etc., in order to provide a thorough understanding of the invention. It is to be appreciated that these specific details need not be employed to practice the invention.

Figure 1:
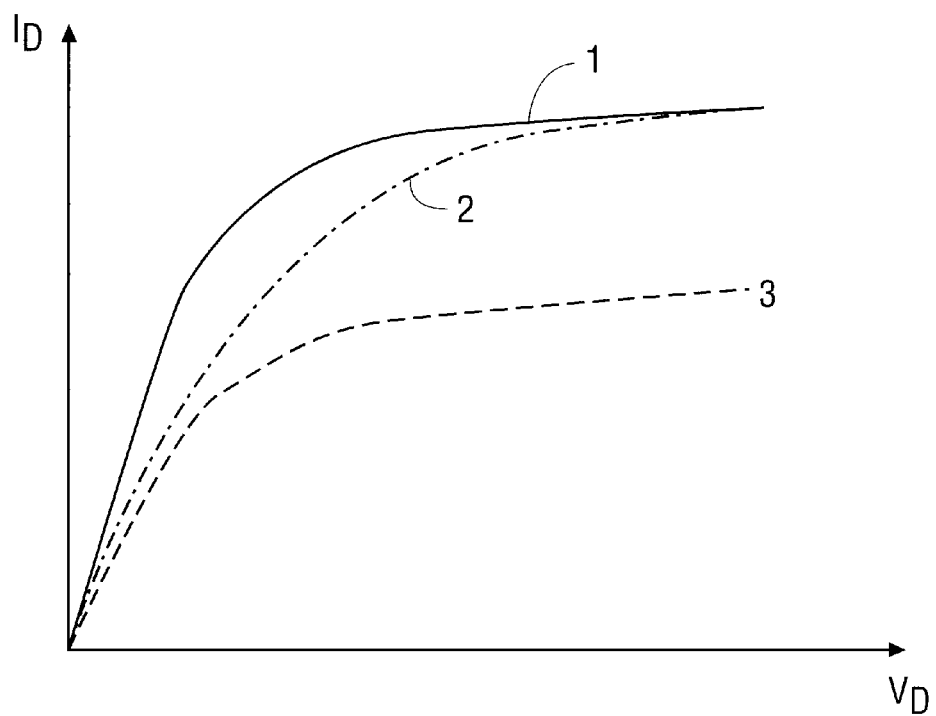
FIG. 1 is a graph of the resistance effect of a typical MOSFET.

Transistor embodiments in accordance with the invention take advantage of individually or separately optimized source and drain region design. The use of the word "optimize" herein is intended to mean reaching the desired state or characteristic of an implantation property, such as for example, junction depth, doping density, channel region encroachment, etc. For example, one embodiment separately optimizes the parasitic resistance of the source and drain. It is recognized that the parasitic resistance on the source side of a device causes a significant decrease in the effective gate drive, while the saturation current of a MOSFET is only slightly affected by the parasitic series resistance in the drain side. FIG. 1 presents a graph of the resistance effect for a typical MOSFET. FIG. 1 presents the drain current ($I_D$), i.e., the current flowing from drain to source when the voltage applied to a gate is constant and greater than the threshold voltage and drain bias voltage $V_{DS}$. The curve identified by reference numeral 1 illustrates the ideal situation where the device is not effected by parasitic resistance. Curve 2 illustrates the resistance effect of the drain region. Curve 3 illustrates the resistance effect of the source. FIG. 1 shows that the parasitic resistance effects from source and drain are quite different. The parasitic resistance on the source side causes a significant decrease in the effective gate drive. The saturation current of a MOSFET, however, is only slightly effected by the parasitic resistance in the drain side. Thus, reducing the parasitic source resistance has a much greater effect on gate drive.

Reliability issues and short channel effects are mostly related with the high electric field at the drain junction. Therefore, it is mainly the drain structure that will yield the benefits of high reliability and better short channel behavior. With separately optimized source and drain structures, a device may achieve both superior performance and better short channel characteristics and reliability for future submicron generation MOSFET technology.

Figure 2:
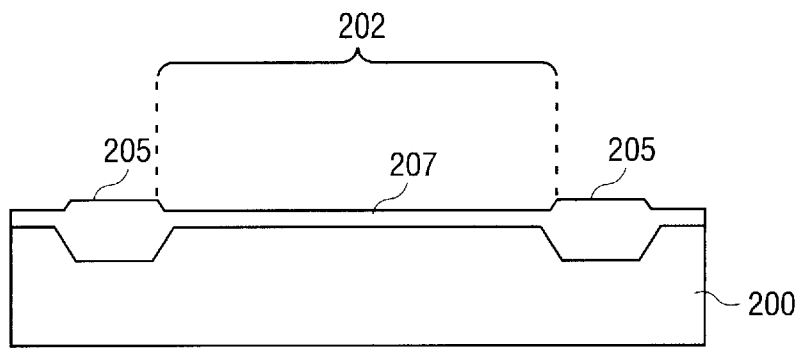
FIG. 2 is a schematic diagram of a planar side view of a portion of a semiconductor substrate showing an active area of the substrate defined by opposing isolation structures and a gate oxide disposed on the substrate for a first embodiment of a method of forming an asymmetric transistor in accordance with the invention.

An embodiment for a process to form a self-aligned transistor with separately optimized of source and drain regions is illustrated in FIGS. 2–9. In FIG. 2, conventional shallow-trench isolation techniques are used to define an active region 202 between shallow dielectric trenches 205 of a semiconductor (e.g., silicon) substrate 200. The method described in this particular embodiment uses shallow-trench isolation techniques. It is to be appreciated that other techniques, such as for example Local Oxidation of Silicon (LOCOS), may also be used to define the active region of semiconductor substrate 200.

Figure 3:
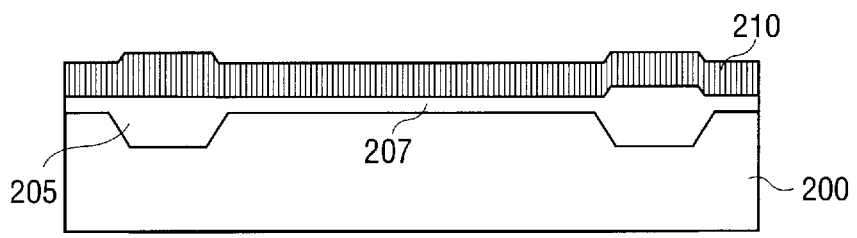
FIG. 3 is a schematic diagram of a planar side view of a portion of a semiconductor substrate showing an edge-defining layer deposited over the substrate for a first embodiment of a method of making an asymmetric transistor in accordance with the invention.

Having defined active region 202, a gate oxide 207 is formed over active region 202. Gate oxide 207 is, for example, a silicon oxide ($SiO_2$) that is thermally grown in the active region of substrate 200. Next, as illustrated in FIG. 3, an edge-defining layer 210 is deposited over gate oxide 207. Edge-defining layer 210 is deposited to an appropriate thickness, equivalent to the desired thickness of a gate in the active region, which is typically approximately 2500 Å–3500 Å. The material for edge-defining layer 210 should have a high etch selectivity with respect to gate oxide 207 and the conductive material to be added in the subsequent step. For example, silicon nitride ($Si_3N_4$) is an appropriate edge-defining layer 210 material for a $SiO_2$ gate oxide layer 207 and a polysilicon conductive material.

Figure 4:
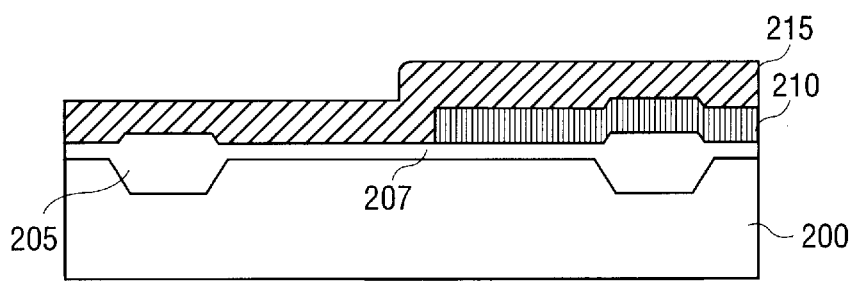
FIG. 4 is a schematic diagram of a planar side view of a portion of a semiconductor substrate showing a conductive layer overlying a patterned edge-defining layer in accordance with a first embodiment of the invention.
Figure 5:
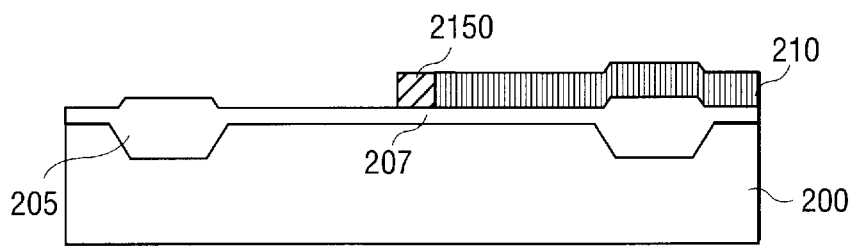
FIG. 5 is a schematic diagram of a planar side view of a portion of a semiconductor substrate showing a patterned conductive gate adjacent to an edge-defining layer in accordance with a first embodiment of the invention.

FIG. 4 shows the subsequent processing steps of patterning edge-defining layer 210 and depositing conductive material 215. First, edge-defining layer 210 is patterned by removing, for example with an anisotropic etch, edge-defining layer 210 material from a portion of the active region such that edge-defining layer 210 is patterned to the location of an edge of a desired transistor gate in the active region. Edge-defining layer 210 is patterned using standard dry etching techniques. For example, a $Si_3N_4$ edge-defining layer is removed anisotropically using, for example, a $CHF_3/O_2$ etch chemistry. As noted, the etch should be anisotropic so that the patterned edge-defining layer 210 has a defined, substantially vertical edge that will subsequently define a gate edge.

Once edge-defining layer 210 is patterned, a conductive layer 215, such as for example polysilicon, is deposited conformally on top of edge-defining layer 210 and gate oxide 207 to a thickness approximately equal to a desired transistor gate length, such as 0.18 μm. This is followed by, as shown schematically in FIG. 5, the step of patterning a conductive layer 215 spacer gate by an anisotropic selective etching of conductive layer 215. In the example of a polysilicon conductive material 215, the anisotropic etch is carried out, for example, by a plasma etching with, for example, a $HBr/HCl/O_2$ gas etchant chemistry. The patterning step to form conductive layer spacer gate 2150 is anisotropic to define the structure of spacer gate 2150, as spacer gate 2150 will ultimately form a transistor gate in active region 202 of substrate 200. The anisotropic etch will remove conductive material from the surface of edge-defining layer 210 and from gate oxide 207 except that area defined by spacer gate 2150.

Figure 6:
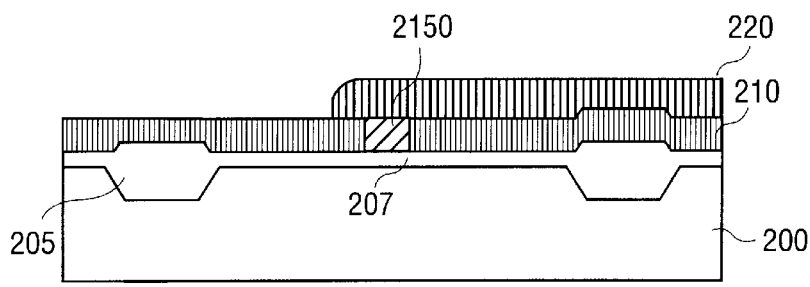
FIG. 6 is a schematic diagram of a planar side view of a portion of a semiconductor substrate showing a source implant spacer layer conformally overlying an active area of a substrate in accordance with a first embodiment of the invention.

Next, as shown in FIG. 6, an optional step of the formation of a source-side implantation spacer is shown. In this embodiment, a dielectric material 220, for example, $Si_3N_4$, is conformally deposited in active region 202 as shown in FIG. 6 and patterned into a sidewall spacer 2200 adjacent spacer gate 2150 as shown schematically in FIG. 7. In the embodiment shown, source-side implantation spacer 2200 is of the same dielectric material as that of edge-defining layer 210 (e.g., $Si_3N_4$). As noted, the formation of source-side implantation spacer 2200 is optional and, if source-side implantation spacer 2200 is unnecessary, the process can proceed directly to source ion implantation for source optimization as shown schematically in FIG. 7.

Figure 7:
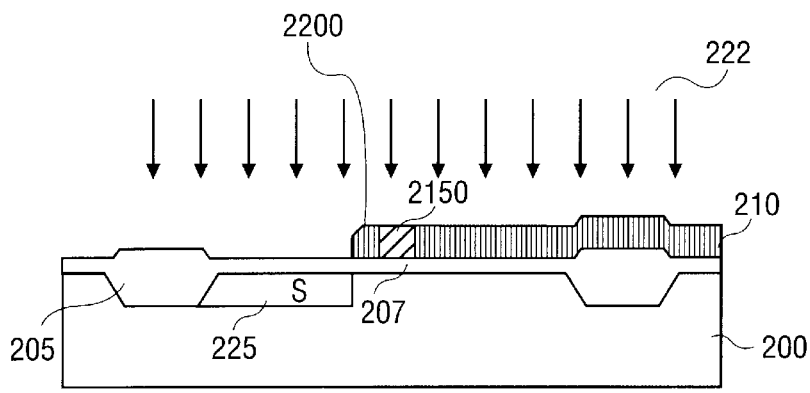
FIG. 7 is a schematic diagram of a planar side view of a portion of a semiconductor substrate showing a patterned source implant spacer, conductive material gate, and edge defining layer and also showing source implantation in accordance with a first embodiment of the invention.

FIG. 7 presents the source ion implantation for source optimization. In FIG. 7, a source region 225 is exposed (covered in this case only by gate oxide 207) and impurities are implanted in substrate 200 to form source region 225. The implantation of the impurities proceeds by the ion implantation method, illustrated schematically by reference numeral 222. For example, with an n-type substrate or an n-type well, a boron or boron fluoride ($BF_2$) dopant can be implanted into substrate 200 to form source region 225. In the case of a p-type substrate or p-type well, a different dopant, such as for example arsenic (As), phosphorous (P), etc., can be implanted to create source region 225. Source region 225 is optimized, for example, by increased ion doping to minimize the parasitic resistance of the device. The specific dopant recipe and implantation will depend on the optimization purpose. In this embodiment, the implantation is self-aligned to implantation spacer 2200.

Once source region 225 is formed and optimized in substrate 200, edge-defining layer 210 and optional source-side implantation spacer 2200 is/are removed by, for example, a chemical etch. For example, a $Si_3N_4$ edge-defining layer 210 and source-side implantation spacer 2200 are removed using, for example, a $CHF_3/O_2$ etch chemistry. The same layers may alternatively be removed by wet etching, such as for example, by hot phosphoric acid.

Figure 8:
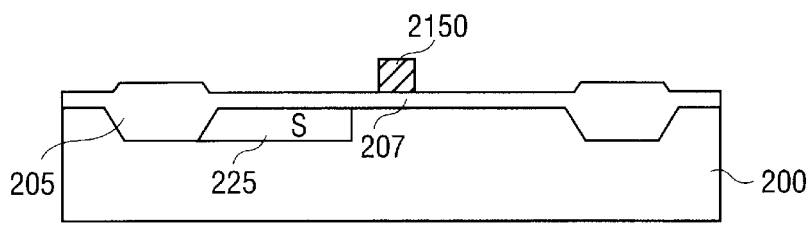
FIG. 8 is a schematic diagram of a planar side view of a portion of a semiconductor substrate showing a patterned gate and a source region individually optimized in accordance with a first embodiment of the invention.
Figure 9:
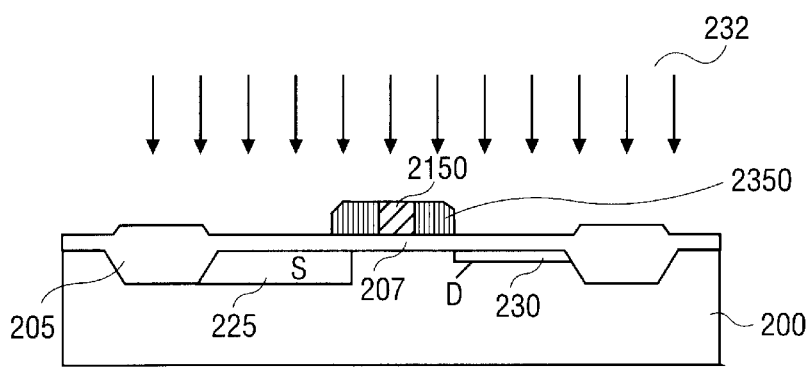
FIG. 9 is a schematic diagram of a planar side view of a portion of a semiconductor substrate showing a patterned gate having sidewall spacers and separately optimized source and drain region implantation in accordance with a first embodiment of the invention.
Figure 10:
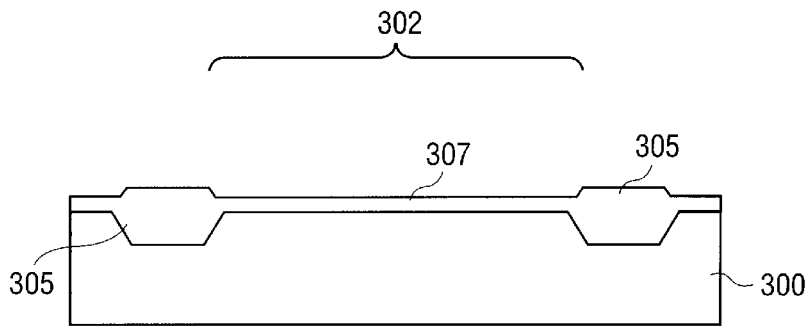
FIG. 10 is a schematic diagram of a planar side view of a portion of a semiconductor substrate showing an active area of the substrate defined by opposing isolation structures and a gate oxide disposed on the substrate for a second embodiment of a method of forming a transistor with separately optimized source and drain regions in accordance with the invention.

FIG. 8 shows a schematic representation of spacer gate 2150 overlying gate oxide 207 with source region 225 formed in substrate 200. FIG. 9 schematically illustrates the further processing steps associated with transistor formation in the active region of substrate 200. The remaining steps follow conventional MOSFET processing steps with spacer 2350 formation and source/drain formation. A difference of the process embodiment described and conventional processes, however, is that the source/drain implantation step at this point is concerned only with drain region 230 optimization. In this embodiment, this is particularly the case where the implantation dose for source region 225 is very high and junction depth deep (e.g., to reduce the parasitic resistance effect of source region 225). The high implantation dosage of source region 225 will dominate any second implantation into source region 225, e.g., the second implantation defining drain region 230, and have little, if any, effect on source region 225. FIG. 9 schematically illustrates a transistor consisting of gate 215 and separately optimized source and drain regions 225 and 230, respectively, in the active region of substrate 200.

FIGS. 10–18 schematically illustrate a second embodiment of a process for forming a MOSFET having separately optimized source and drain regions. First, as shown schematically in FIG. 10, an active region 302 is formed in semiconductor (e.g., silicon) substrate 300, active region 302 defined between a pair of opposing shallow dielectric trenches 305. Once again, trench isolation is presented, it being understood that other forms of isolation, such as for example LOCOS isolation, may be used.

Figure 11:
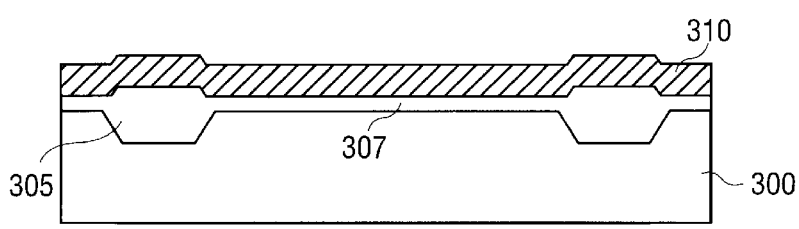
FIG. 11 is a schematic diagram of a planar side view of a portion of a semiconductor substrate showing a conductive material layer deposited over the substrate in accordance with a second embodiment of the invention.

Overlying active region 302 of substrate 300 is a gate oxide, such as for example, a $SiO_2$ that is thermally grown on substrate 300. After gate oxide 307 formation, FIG. 11 schematically presents the next step of depositing a conductive layer 310, such as for example, a polysilicon layer deposited by chemical vapor deposition over active region 302 of substrate 300. In this embodiment, conductive layer 310 is deposited to a thickness suitable for a transistor gate, typically around 2500–3500 Å.

Figure 12:
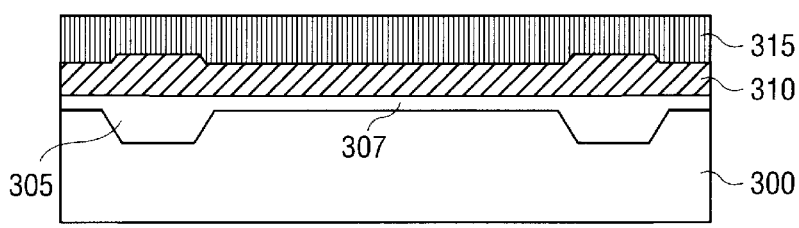
FIG. 12 is a schematic diagram of a planar side view of a portion of a semiconductor substrate showing an edge-defining layer deposited over the conductive material layer in accordance with a second embodiment of the invention.
Figure 13:
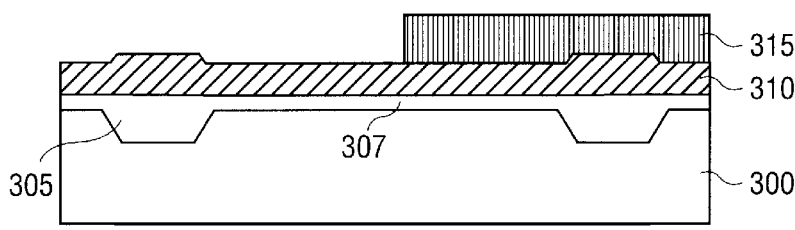
FIG. 13 is a schematic diagram of a planar side view of a portion of a semiconductor substrate showing a patterned edge-defining layer over the conducting layer material in accordance with a second embodiment of the invention.

FIG. 12 schematically shows the next step of the process that is the deposition of edge-defining layer 315, such as for example, by chemical vapor deposition, over conductive layer 310. In the second embodiment, edge-defining layer 315 may be the same material as, or a different material than, gate oxide 307. Next, edge-defining layer 315 is patterned to conductive layer 310 as shown schematically in FIG. 13. The thickness of edge-defining layer 315 can vary, for example, between several thousand angstroms to one micron, and will vary in accordance with other aspects of semiconductor processing as known by those of ordinary skill in the art. Conductive layer 310 is generally thicker than edge-defining layer 315, a thickness commensurate with a transistor gate, so the selectivity of the etchant between edge-defining layer 315 and conductive layer 310 is not as critical as the first embodiment where high selectivity between edge-defining layer and gate oxide is warranted. Also, because gate oxide layer 307 is protected by conductive layer 310, gate oxide layer 307 is not likely to be damaged in a subsequent edge-defining layer 315 removal step.

The patterning of edge-defining layer 315 is accomplished by an anisotropic etch to remove edge-defining layer 315 material from a portion of the active region and to expose a portion of conductive layer 310. A portion of edge-defining layer 315 remains in the active area of substrate 300 to define an edge for a subsequent transistor gate. For an edge-defining layer 315 of $SiO_2$, a $CHF_3/CF_4/O_2$ etch chemistry is used under anisotropic etch conditions to form an edge-defining layer with a substantially vertical sidewall.

Figure 14:
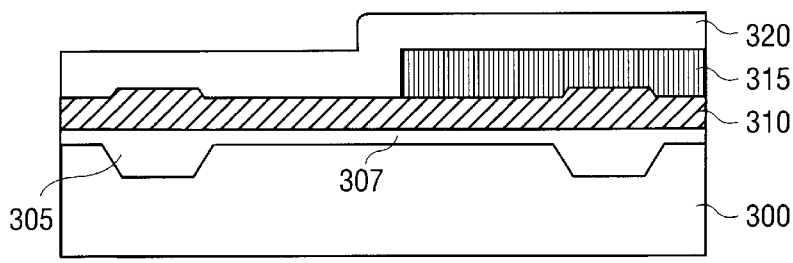
FIG. 14 is a schematic diagram of a planar side view of a portion of a semiconductor substrate showing a spacer-gate defining layer conformally deposited over an active area of the substrate in accordance with a second embodiment of the invention.

Next, as shown schematically in FIG. 14, a spacer masking layer 320 is conformally deposited over active region 302, over conductive layer 310 and edge-defining layer 315. Spacer masking layer 320 is patterned into a masking spacer layer 320 that defines and protects a portion of conductive material 310 that will ultimately form a transistor gate. Suitable etching selectivity is important between conductive layer 310, edge-defining layer 315 and spacer masking layer 320. Therefore, different materials should be used for conductive layer 310, edge-defining layer 315, and spacer masking layer 320. For example, different dielectric materials are used for edge-defining layer 315 and spacer masking layer 320, for example, $SiO_2$ and $Si_3N_4$, respectively.

Figure 15:
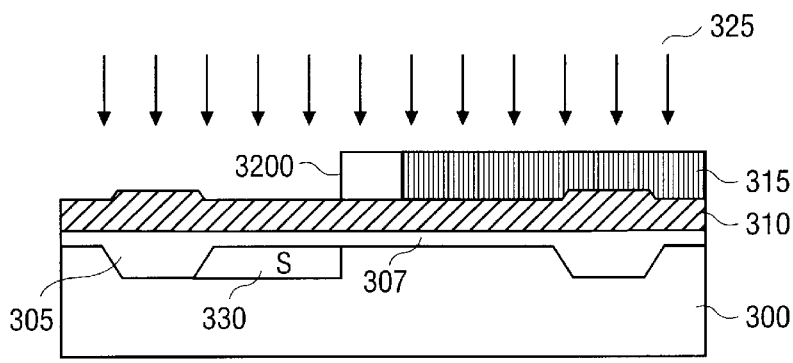
FIG. 15 is a schematic diagram of a planar side view of a portion of a semiconductor substrate showing a defined spacer formed over the conductive layer material and individually optimized source implantation in accordance with a second embodiment of the invention.

As illustrated in FIG. 15, spacer masking layer 320 is patterned to a mask 3200 to protect a portion of conductive material 310 that will subsequently be a gate of a transistor.

Spacer mask 3200 and edge-defining layer 315 shelter the gate and drain portions of material layer 310 and substrate 300, respectively, from an ion implantation 325 that is performed to form source region 330. In FIG. 15, spacer mask 3200 and edge-defining layer 315 shelter the gate and drain portions of conductive material layer 310 and substrate 300, respectively, from source ion implantation 325 so that the implantation of the source region will be self-aligned to the gate edge. It is to be appreciated that an extra spacer can also be formed around the spacer masking layer 320 so as to make the subsequent ion implantation self-aligned to the edge of a spacer portion away from the transistor gate.

FIG. 15 shows ion implantation 325 preceding through a portion of conductive material layer 310, through gate oxide layer 307, and into substrate 300 to form a source region 330 of a transistor. The implantation characteristic of source region 330 is optimized at this time for best performance results (e.g., deep junction, over drive-in, etc.). For an n-type substrate or n-type well, p-type dopant, such as for example, boron or boron fluoride is implanted. For a p-type substrate or p-type well, n-type dopant, such as for example, arsenic or phosphorous is implanted. Various doses and energy can be applied to achieve desired optimized source junction design.

Figure 16:
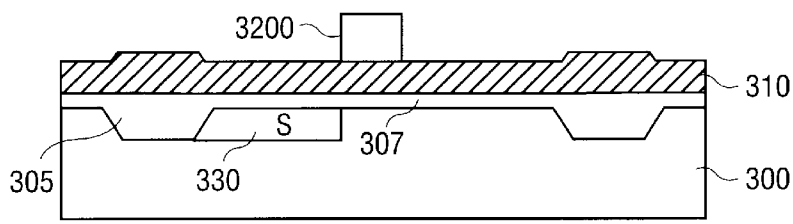
FIG. 16 is a schematic diagram of a planar side view of a portion of a semiconductor substrate showing a spacer-gate overlying the conductive layer material in accordance with a second embodiment of the invention.

Once source region 330 is formed, edge-defining layer is selectively removed. For example, a wet HF etch chemistry can be used to selectively etch a $SiO_2$ edge-defining layer 315 to conductive material 310, and selectively leave intact spacer mask 3200. Thus, FIG. 16 schematically shows spacer mask 3200 formed over conductive layer 310 to define a portion of conductive material layer 310 that will be a transistor gate.

Next, conductive material layer 310 is etched to remove the unprotected conductive material from the active area. Conductive material layer 310 portion that is to be a transistor gate is protected from an etchant by spacer masking layer 320. A suitable etchant to etch a polysilicon material is a $HBr/HCl/O_2$ gas etchant chemistry.

Figure 17:
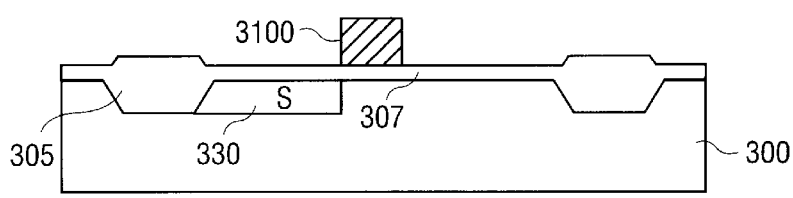
FIG. 17 is a schematic diagram of a planar side view of a portion of a semiconductor substrate showing a patterned gate and source region in an active area of a substrate in accordance with a second embodiment of the invention.
Figure 18:
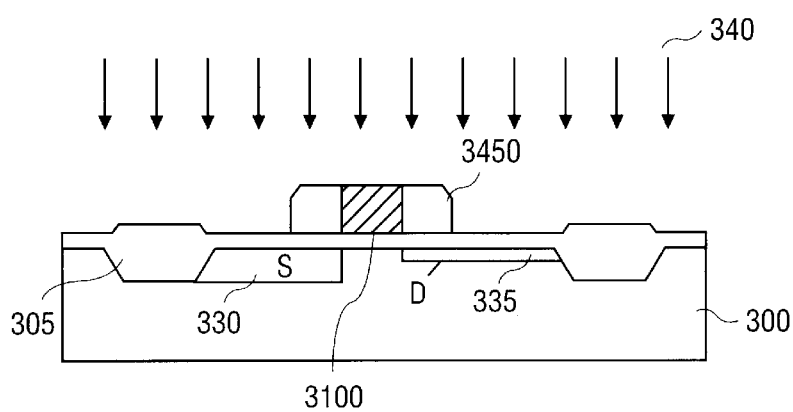
FIG. 18 is a schematic diagram of a planar side view of a portion of a semiconductor substrate showing a patterned gate having sidewall spacers and separately optimized source and drain regions in accordance with a second embodiment of the invention.

Once transistor gate 3100 is formed, spacer mask 3200 is removed. Spacer mask 3200 of $Si_3N_4$ may be removed, for example, by a $CHF_3/O_2$ etch chemistry or alternatively may be removed selectively by wet etching, such as for example, by hot phosphoric acid. Thus, as shown in FIG. 17, conductive material portion or transistor gate 3100 overlies gate oxide 307 in an active region of substrate 300 having formed therein an optimized source region 330. Next, as shown in FIG. 18, standard processing steps are used to form the transistor, with doped region optimization again focused on optimizing the implantation characteristics of drain region 335. Thus, FIG. 18 shows a transistor having a conductive material (e.g., polysilicon) gate 3100 with dielectric sidewall spacers 3450 and overlying an active region of a substrate 300 having separately optimized source region 330 and drain region 335.

The second processing embodiment differs from the first processing embodiment in that the conductive material layer 310 that is deposited over gate oxide layer 307 provides an etchant protective layer for a thin gate oxide 307 during edge-defining layer 315 removal and alleviates the need for high etching selectivity between gate oxide layer 307 and edge-defining layer 315. Further, since the source implantation must go through conductive layer 310, a relatively higher implantation energy, depending on the source junction design and polysilicon thickness, is needed to optimize source region 330.

Figure 19:
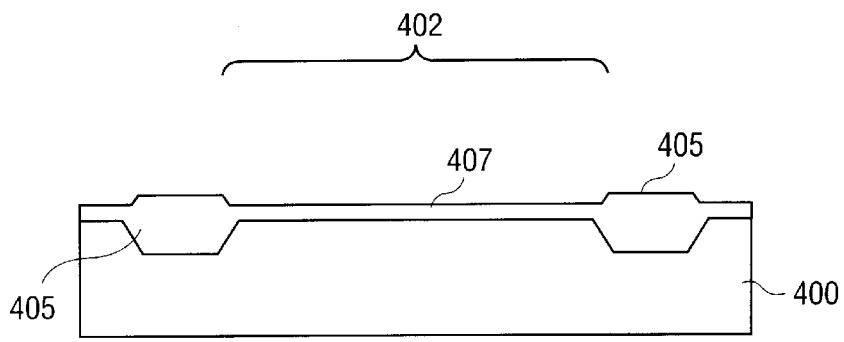
FIG. 19 is a schematic diagram of a planar side view of a portion of a semiconductor substrate showing an active area of a substrate defined by opposing isolation structures and a gate oxide disposed on the substrate for a third embodiment of a method of forming a transistor with separately optimized source and drain regions in accordance with the invention.

FIGS. 19–27 schematically present a third embodiment of a process for forming a MOSFET with separately optimized source and drain regions. First, as shown in FIG. 19 and similar to the first and second process embodiments, an active region 402 is defined between opposing shallow isolation trenches 405 in semiconductor substrate 400. Next, gate oxide layer 407 is formed over the substrate surface, such as for example by thermal oxidation.

Figure 20:
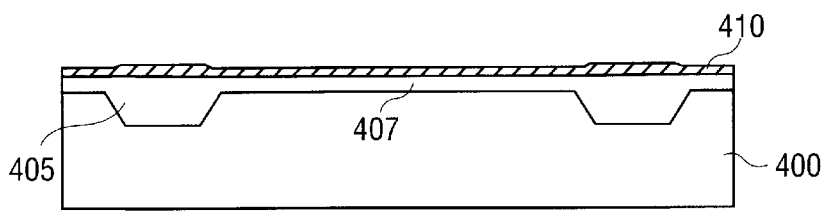
FIG. 20 is a schematic diagram of a planar side view of a portion of a semiconductor substrate showing a thin layer of conductive material deposited over an active area of the substrate in accordance with a third embodiment of the invention.

FIG. 20 shows the subsequent step of depositing a thin layer 410 of conductive material, such as for example, polysilicon, over the active area of substrate 400. Conductive material layer 410 protects the gate oxide underneath and is thin enough to obviate the need for excessively high energy implantation of the source region. For example, a conductive material layer 410 of polysilicon is deposited in a thickness range of approximately 200–300 Å.

Figure 21:
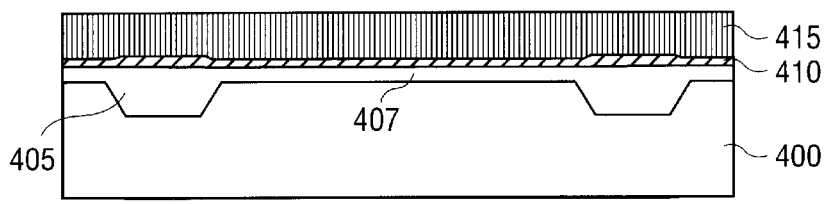
FIG. 21 is a schematic diagram of a planar side view of a portion of a semiconductor substrate showing an edge-defining layer deposited over the thin layer of conductive material in accordance with a third embodiment of the invention.
Figure 22:
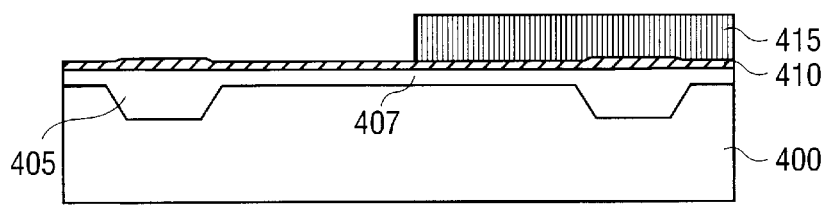
FIG. 22 is a schematic diagram of a planar side view of a portion of a semiconductor substrate showing a patterned edge-defining layer overlying the thin layer of conductive material in accordance with a third embodiment of the invention.

FIG. 21 schematically shows the subsequent step of depositing edge-defining layer 415 over conductive layer 410. Edge-defining layer 415 is for example a dielectric, such as for example, $Si_3N_4$. Edge-defining layer is deposited to a thickness approximately equivalent to the desired thickness of a transistor gate, typically around 2000Å–3000Å. Next, edge-defining layer 415 is patterned, as shown in FIG. 22, to expose a portion of conductive material layer 410 in active region 402 and to define an edge for a future transistor gate.

Figure 23:
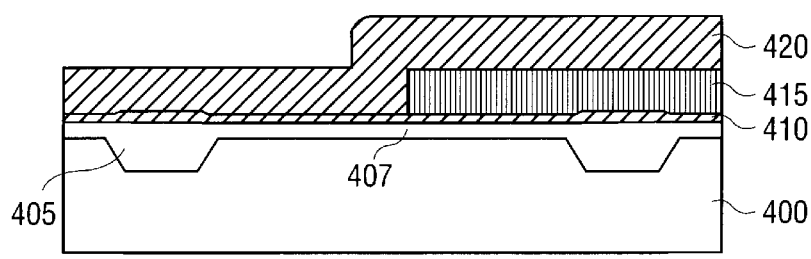
FIG. 23 is a schematic diagram of a planar side view of a portion of a semiconductor substrate showing a second conductive material deposited over the active area of the substrate in accordance with a third embodiment of the invention.
Figure 24:
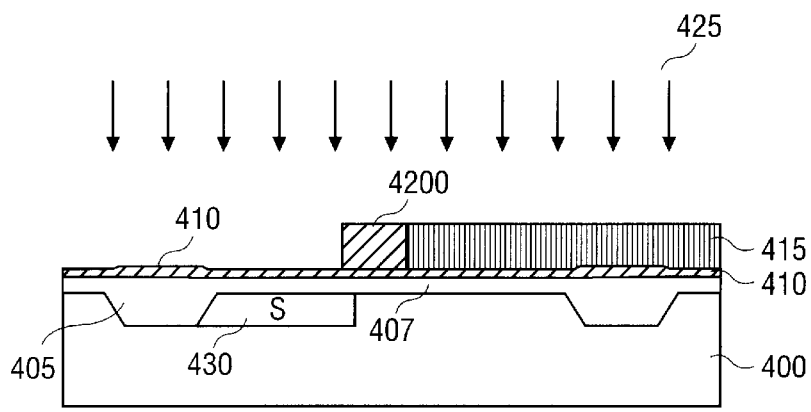
FIG. 24 is a schematic diagram of a planar side view of a portion of a semiconductor substrate showing a spacer-gate formed on the substrate adjacent to an edge-defining layer and individually optimized source implantation through the thin layer of conductive material in accordance with a third embodiment of the invention.
Figure 25:
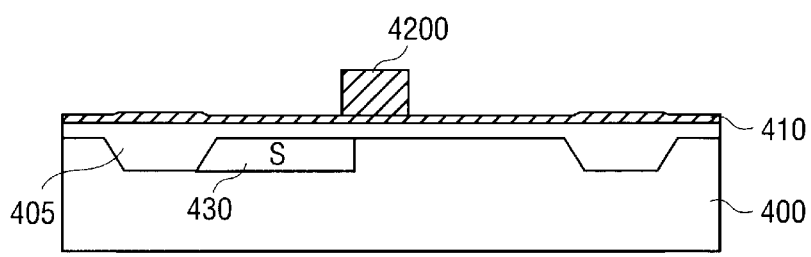
FIG. 25 is a schematic diagram of a planar side view of a portion of a semiconductor substrate showing a source region in the substrate and a spacer-gate overlying a thin layer of conductive material in accordance with a third embodiment of the invention.

FIG. 23 shows the next step of the conformal deposition of second conductive layer 420 (i.e., a conductive spacer layer) over active area 402 of substrate 400. Conductive layer 420 is, for example, polysilicon and is deposited to a thickness approximating the desired length of a transistor gate. Next, as illustrated in FIG. 24, second conductive material 420 is patterned into spacer gate 4200. Second conductive material 420 also serves as a mask for subsequent implantation step of substrate 400.

FIG. 24 shows ion implantation 425 creating source region 430 by implanting through thin conductive material (e.g., polysilicon) layer 410, through gate oxide layer 407, and into substrate 400 to define a source region of substrate 400. The implantation characteristic of source region 430 is optimized (i.e., heavily doped junction, drive-in, heat, etc.).

In the embodiment described, conductive material layer 410 is thin, such as for example on the order of 200–300 Å of polysilicon. Layer 410 is thin enough to allow better, optimal source implantation depth control than through a thick polysilicon layer as described in the second embodiment, but still protects gate oxide layer 407 during subsequent edge-defining layer etching.

In case a source-side implantation spacer is needed, it is to be appreciated that an additional dielectric material, such as for example, the same dielectric material as edge-defining layer 415, may be deposited and patterned adjacent patterned second conductive material layer 420 and the source implantation may be self-aligned to the spacer portion.

Figure 26:
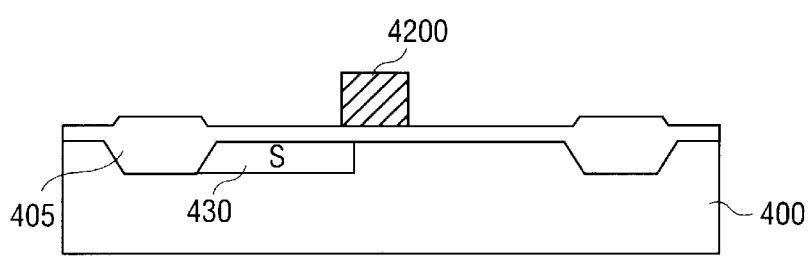
FIG. 26 is a schematic diagram of a planar side view of a portion of a semiconductor substrate showing a source region in the substrate and a patterned gate overlying a gate oxide in an active region of the substrate in accordance with a third embodiment of the invention.
Figure 27:
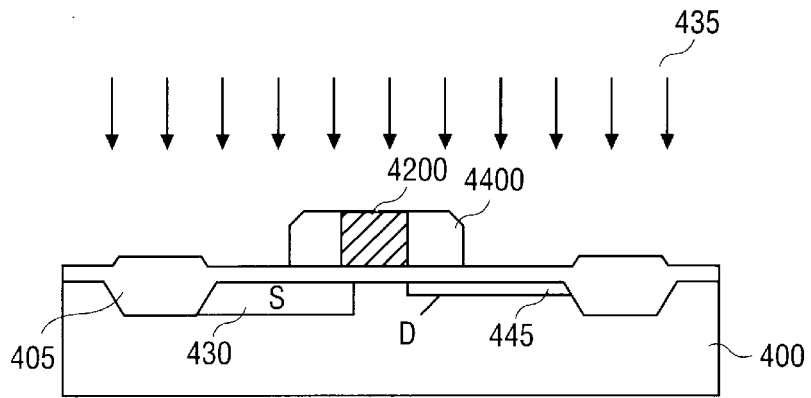
FIG. 27 is a schematic diagram of a planar side view of a portion of a semiconductor substrate showing a patterned gate having sidewall spacers and separately optimized source and drain regions in accordance with a third embodiment of the invention.

Once source region 430 is formed, edge-defining layer 415 (and optional source-implant spacer) are removed (FIG. 25), and the patterned spacer gate 4200 is used as a masking layer for self-aligned conductive material layer 410 removal as shown in FIG. 26. Once conductive material layer 410 is removed, conventional processing steps are used to form a MOSFET device in active area 400. The diffusion region optimization focuses, as with the first and second embodiments, on the implantation characteristic of drain region 445 at this stage.

By separately optimizing the source and drain regions of a transistor device, the properties of that device may be significantly improved. Forming deep junctions, for example, in the source region significantly reduces the parasitic resistance of the device, while a lightly doped drain or shallow junction design of a drain region improves the hot electron reliability and short channel characteristics of the device. Since the drain optimization is done to the exclusion of the source region, the technique will further optimize the performance of the device.

Figure 28:
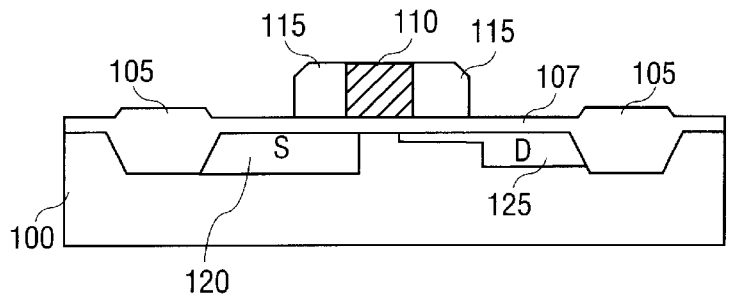
FIG. 28 is a schematic diagram of a planar side view of a portion of a semiconductor substrate showing an embodiment of a field effect transistor having separately optimized source/drain regions in accordance with the invention.

FIG. 28 illustrates individually optimized source and drain region design. FIG. 28 shows a substrate 100 having an active region defined by shallow trench isolation structures 105. In the active region is a transistor made up of a gate 110 with adjacent sidewall spacers 115 on substrate 100 and source region 120 and drain region 125 adjacent gate 110 in substrate 100. In FIG. 28, source 120 and drain 125 are separately optimized. FIG. 28 shows a source region 120 that is maximized by increased doping to minimize the source/drain parasitic resistance of the MOSFET. The drain region 125, on the other hand, is formed by lightly doped drain techniques to improve the hot carrier reliability of the device. The LDD design of drain region 125 provides better reliability and reduces the channel electric field. If, as conventionally done, source region 120 was designed as shallowly (or doped as lightly), source region 120 would have a large resistance and the device performance would be poor. However, the current degradation due to resistance on the drain region side is small, because of the saturation characteristics of the device, and, at drain voltages larger than the saturation voltage, there would be only a small negative effect to device driving current. Thus, FIG. 28 illustrates an embodiment of a MOSFET with asymmetrical diffusion region design (i.e., a heavily doped source region 120 and a lightly dope drain region 125) where the electric field of the device is reduced, the device is more reliable, and the device performance is as good as a non-LDD device.

Figure 29:
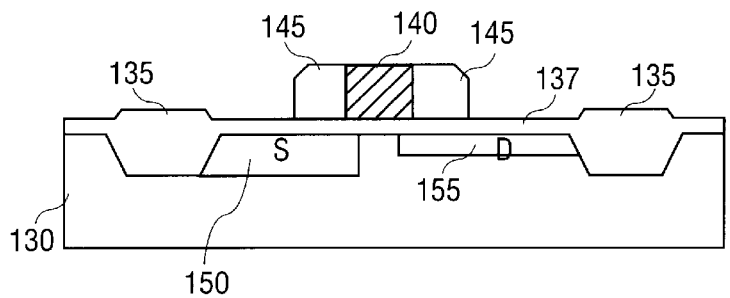
FIG. 29 is a schematic diagram of a planar side view of a portion of a semiconductor substrate showing a second embodiment of a field effect transistor having separately optimized source/drain regions in accordance with the invention.

FIG. 29 illustrates another embodiment of the invention wherein a MOSFET is designed with asymmetrical diffusion regions. In FIG. 29, like FIG. 28, source region 150 and drain region 155 are separately optimized. The implantation property in this case is junction depth. Source region 150 is implanted so as to be a deep-source region that lowers the parasitic resistance of the device. Drain region 155, on the other hand, is optimized as a shallow junction to improve the short-channel effects of the device.

Figure 30:
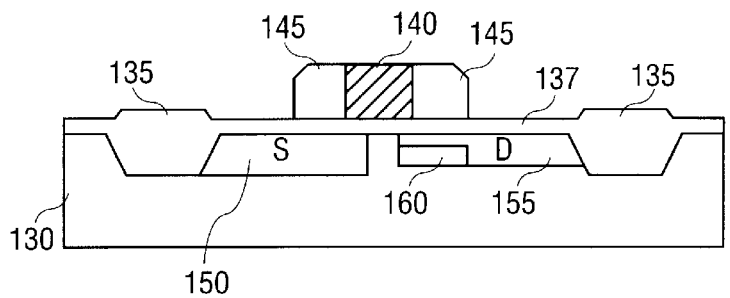
FIG. 30 is a schematic diagram of a planar side view of a portion of a semiconductor substrate showing a third embodiment of a field effect transistor having separately optimized source/drain regions in accordance with the invention.

FIG. 30 shows an embodiment of the invention showing a MOSFET with an asymmetric diffusion region design. FIG. 30 illustrates that the implantation characteristic of source region 150 is optimized by increased doping to minimize the source/drain parasitic resistance of the MOSFET. The implantation characteristic of drain region 155 is designed to inhibit the short-channel effects on the device. Specifically, as noted above, the short-channel effects such as $V_t$ roll-off, punch-through, and DIBL can be improved by the formation of specialized shallow junctions, particularly in the drain region. These short-channel effects can be minimized or prevented by pocket counter-doping of drain region 155, for example, with a boron implant 160 in NMOS, as illustrated in FIG. 30.

Figure 31:
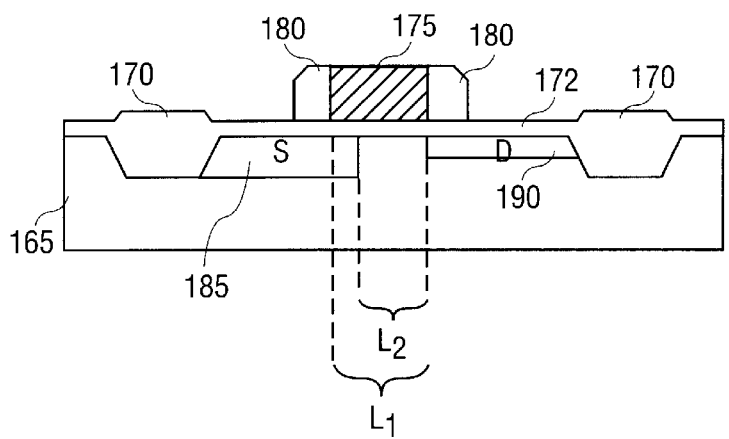
FIG. 31 is a schematic diagram of a planar side view of a portion of a semiconductor substrate showing a fourth embodiment of a field effect transistor having separately optimized source/drain regions in accordance with the invention.

Another advantage of the separate optimization of source and drain regions is on the ability to optimize the trade-off between overlap capacitance and the effect of channel length. By over drive-in of the source/drain junctions, a smaller effective channel length can be obtained for the penalty of a large gate/source and gate/drain overlap, which in turn contributes to more overlap loading capacitance. Overlap loading capacitance in the drain side can contribute as much as twice as much loading as that of the source side with the same overlap because of the output voltage swing at the drain node. Thus, to optimize the device such that a shorter effective gate length is obtained while at the same time minimizing the overlap capacitance, FIG. 31 shows a source region 185 with a source overlap of gate 175 that m is increased and a drain region 190 with a drain overlap that is reduced as illustrated. FIG. 31 shows semiconductor substrate 165 having a MOSFET device electrically isolated by shallow dielectric trenches 170, the device including gate 175 with adjacent dielectric sidewall spacers 180 overlying gate oxide 172. In FIG. 31, $L_1$ illustrates the length of gate 175, i.e., the gate length, while $L_2$ illustrates the effective gate-length or channel length. The effective gate-length is formed by the over drive-in of the source region to overlap gate 175 in substrate 165. In FIG. 31, source region 185 overlaps gate 175, but drain region 190 just barely overlaps.

In sub–0.1 micron device regimes, velocity overshoot and ballistic transport effects are expected to play a major role in enhancing device performance. Using a specifically optimized source structure in an asymmetric MOSFET design will create a channel field distribution favorable for such none-equilibrium carrier transport.

It is also noted that there may exist applications where a heavily-doped drain region is needed. The invention described above can be equally applied where the source region is exchanged with the drain region with the same design and process equally utilized.

The preceding discussion described the separate formation and optimization of source and drain structures principally by ion implantation. It is to be appreciated that the invention contemplates other methods of forming these doped regions, including but not limited to, the process of diffusion.

As has been demonstrated in the embodiments discussed above, a transistor device with separately optimized and thus asymmetric source and drain regions provides the ideal trade-off between device performance and short channel characteristics and reliability for short channel MOSFET devices.

In the preceding detailed description, the invention is described with reference to specific embodiments thereof. It will, however, be evident that various modifications and changes may be made thereto without departing from the broader spirit and scope of the invention as set forth in the claims. The specification and drawings are, accordingly, to be regarded in an illustrative rather than a restrictive sense.

What is claimed is:

1. A field effect transistor, comprising:
   a semiconductor substrate having a first doped region and a second doped region separated from said first doped region; and
   a gate electrode overlying a surface of said semiconductor substrate and dimensions of said gate electrode defining a symmetric channel region of said semiconductor substrate and having dimensions of a gate length and a gate height,
   said first doped region and said second doped region defined by an implantation property,
   said implantation property of said first doped region having a first implantation characteristic and said implantation property of said second doped region having a different second implantation characteristic,
   one of said first doped region and said second doped region substantially encroaches a first area of said symmetric channel region beneath said gate electrode, and
   the other of said first doped region and said second doped region encroaches a second area of said symmetric channel region beneath said gate electrode, the second area of encroachment being less than the first area of encroachment.

2. The transistor of claim 1, wherein said implantation property is junction depth and wherein said junction depth of said first doped region is greater than said junction depth of said second doped region.

3. The transistor of claim 1, wherein said implantation property is doping density, and wherein said doping density of said first doped region is greater than said doping density of said second doped region.

4. The transistor of claim 1, wherein said first doped region is a source region and wherein said second doped region is a drain region.

5. The transistor of claim 1, further comprising:
   spacers formed on the substrate adjacent opposing sidewalls of said gate, wherein said channel region has a cross-sectional area defined between the source region and the drain region.

6. The transistor of claim 4, wherein the drain region comprises a counter-doped pocket region.

7. A transistor device comprising:
   a semiconductor substrate having a source region and a drain region separated from said source region by a symmetric channel region; and
   a gate electrode overlying a gate area of a surface of said semiconductor substrate over a portion of said symmetric channel region with dimensions comprising a substantially uniform gate length of less than 2000 Å and a height,
   wherein said symmetric channel region has a cross-sectional area defined between the source region and the drain region, and
   wherein the drain region encroaches said symmetric channel region and said source region substantially encroaches said symmetric channel region, the drain region encroachment being less than the source region encroachment.

8. The transistor device of claim 7, wherein each of said source region and said drain region has a junction depth and said junction depth of one of said source region and said drain region is greater than said other of said source region and said drain region.

9. The transistor device of claim 7, wherein each of said source region and said drain region has a doping density and said doping density of one of said source region and said drain region is greater than said other of said source region and said drain region.

10. The transistor device of claim 7, further comprising:
    spacers formed on the substrate adjacent opposing sidewalls of said gate, wherein said channel region has a cross-sectional area defined between the source region and the drain region.

11. The transistor of claim 7, wherein the drain region comprises a counter-doped pocket region.

* * * * *

UNITED STATES PATENT AND TRADEMARK OFFICE
CERTIFICATE OF CORRECTION

PATENT NO. : 6,605,845 B1
DATED : August 12, 2003
INVENTOR(S) : Liang

It is certified that error appears in the above-identified patent and that said Letters Patent is hereby corrected as shown below:

<u>Column 10,</u>
Line 64, after "gate 175 that", delete "m".

Signed and Sealed this

Sixteenth Day of December, 2003

JAMES E. ROGAN
*Director of the United States Patent and Trademark Office*